United States Patent
Scantlin et al.

(10) Patent No.: US 10,187,063 B1
(45) Date of Patent: Jan. 22, 2019

(54) SEQUENTIAL LOGIC DEVICE WITH SINGLE-PHASE CLOCK OPERATION

(71) Applicant: Arm Limited, Cambridge (GB)

(72) Inventors: Amanda Ashley Scantlin, Buda, TX (US); Anil Kumar Baratam, Bangalore (IN); James Dennis Dodrill, Dripping Springs, TX (US); Susan Marie Graham, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/826,647

(22) Filed: Nov. 29, 2017

(51) Int. Cl.
 *H03K 3/356* (2006.01)
 *H03K 19/173* (2006.01)
 *H03K 3/012* (2006.01)

(52) U.S. Cl.
 CPC ......... *H03K 19/1733* (2013.01); *H03K 3/012* (2013.01); *H03K 3/356104* (2013.01)

(58) Field of Classification Search
 CPC ............. H03K 19/173; H03K 19/1733; H03K 2217/0054; H03K 3/356043; H03K 3/356104; H03K 3/356139; H03K 3/356147
 USPC ............................................ 326/46, 112–113
 See application file for complete search history.

(56) References Cited

U.S. PATENT DOCUMENTS

| | | | |
|---|---|---|---|
| 5,612,632 A * | 3/1997 | Mahant-Shetti | H03K 3/037 326/46 |
| 5,748,522 A | 5/1998 | Piguet et al. | |
| 8,570,086 B2 | 10/2013 | Hirairi | |
| 2004/0155678 A1* | 8/2004 | Anderson | G01R 31/31854 326/46 |
| 2008/0136448 A1 | 6/2008 | Ng | |
| 2014/0077855 A1 | 3/2014 | Sasagawa | |
| 2015/0116019 A1 | 4/2015 | Hsu et al. | |
| 2015/0207494 A1* | 7/2015 | Kim | H03K 3/356139 327/218 |
| 2016/0056801 A1 | 2/2016 | Cai et al. | |
| 2016/0065184 A1 | 3/2016 | Liu et al. | |
| 2016/0094204 A1 | 3/2016 | Nandi et al. | |

(Continued)

OTHER PUBLICATIONS

Kim, et al.; "27.8 A Static Contention-Free Single-Phase-Clocked 24T Flip-Flop in 45nm for Low-Power Applications"; 2014 IEEE International Solid-State Circuits Conference Digest of Technical Papers (ISSCC), Session 27; pp. 466-468; 2014.

(Continued)

*Primary Examiner* — Jason Crawford
(74) *Attorney, Agent, or Firm* — Pramudji Law Group, PLLC; Ari Pramudji (57) ABSTRACT

Various implementations described herein are directed to a sequential logic device having multiple stages. The sequential logic device may include a first stage having first transistors that are arranged to receive a data input signal and a clock signal and provide a first signal and a second signal based on the data input signal and the clock signal. The sequential logic device may include a second stage having second transistors that are arranged to receive the first signal from the first stage and provide an inverted first signal to a gate of a first pass transistor. The first pass transistor may allow the second signal to pass from the first stage to a second pass transistor based on the inverted first signal, and the second pass transistor may allow the second signal to pass from the first pass transistor to ground based on the clock signal.

7 Claims, 5 Drawing Sheets

(56) References Cited

U.S. PATENT DOCUMENTS

2016/0241219 A1    8/2016   Kim et al.
2016/0261252 A1    9/2016   Agarwal et al.

OTHER PUBLICATIONS

Kawai, et al.; "A Fully Static Topologically-Compressed 21-Transistor Flip-Flop with 75% Power Saying"; 2013 IEEE Asian Solid-State Circuits Conference (A-SSCC); pp. 117-120; 2013.

Teh, et al.; "A 77% Energy-Saving 22-Transistor Single-Phase-Clocking D-Flip-Flop with Adaptive-Coupling Configuration in 40nm CMOS"; 2011 IEEE International Solid-State Circuits Conference Digest of Technical Papers (ISSCC), Session 19; pp. 338-340; 2011.

Hirata, et al.; "The Cross Charge-Control Flip-Flop: a Low-Power and High-Speed Flip-Flop Suitable for Mobile Application SoCs"; 2005 Symposium on VLSI Circuits Digest of Technical Papers; pp. 306-307; 2005.

Hamada, et al; A Conditional Clocking Flip-Flop for Low Power H.264/MPEG-4 Audio/Visual LSI; IEEE 2005 Custom Integrated Circuits Conference; pp. 527-530; 2005.

Rabaey, et al.; "Digital Integrated Circuits: A Design Perspective"; 2nd edition; Prentice Hall; pp. 432-433; 2002.

\* cited by examiner

SEQUENTIAL LOGIC DEVICE WITH SINGLE-PHASE CLOCK OPERATION

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In modern circuit designs, a flip-flop or latch is a circuit that has two stable states and is used as a data storage element. A flip-flop or latch is a fundamental building block for use in digital electronic systems that are typically used in computers, communications, and many other types of devices, such as mobile phones. A flip-flop or latch is configured to store a single bit of data in one of two binary states as a logical one (1) or a logical zero (0). For a flip-flop or latch, an output and a next state may depend on its current input state and also on its current state, such as a previous input.

Generally, a flip-flop or latch is typically clocked, wherein a flip-flop or latch may refer to a clocked circuit. In various instances, a flip-flop is edge-sensitive, and a latch is level-sensitive. That is, when a latch is enabled, the latch may become transparent, while the output of a flip-flop may only change on a single clock edge (whether a rising clock edge or falling clock edge). In some conventional flip-flop or latch circuit scheme, a race condition is found that makes it less robust and unreliable. As such, there exists a need to improve the conventional flip-flop or latch circuit scheme to reduce clock load and power to provide a more reliable and robust flip-flop or latch circuit scheme.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 1B-4 illustrate various schematic diagrams of sequential logic device circuitry that utilizes single-phase clock operation in accordance with various implementations described herein.

DETAILED DESCRIPTION

Various implementations described herein refer to and are directed to schemes and techniques for implementing sequential logic device circuitry or flip-flop circuitry with contention free single-phase clock operation. For instance, the flip-flop with contention free single clock operation may be used as a data flip-flop (DFF) that has been optimized to reduce clock load and power in comparison to a conventional or regular transmission-gate flip-flop. The various implementations described herein may function similar to a normal D-flip-flop (DFF) while removing a common race condition that is found in conventional flip-flops.

Various implementations for providing sequential logic device circuitry utilizing single-phase clock operation will now be described with reference to FIGS. 1A-4.

Figure 1A:
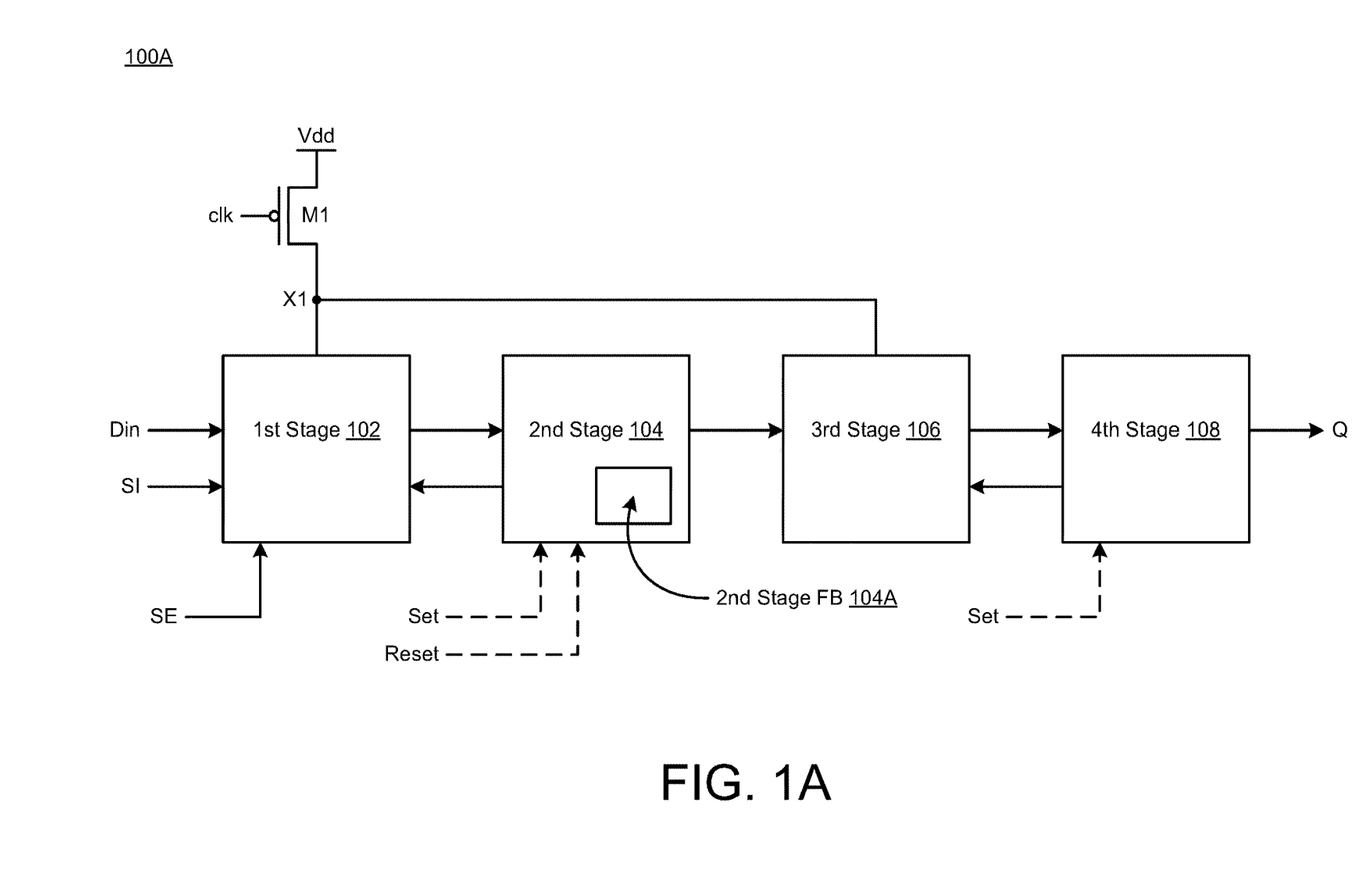
FIG. 1A illustrates a block diagram of sequential logic device circuitry that utilizes single-phase clock operation in accordance with various implementations described herein.

FIG. 1A illustrates a block diagram of sequential logic device circuitry 100A that utilizes single-phase clock operation in accordance with various implementations described herein.

As shown, the sequential logic device circuitry 100A may include multiple stages, such as, e.g., a first stage 102, a second stage 104, a third stage 106, and a fourth stage 108. The second stage 104 may include a feedback stage 104A. The sequential logic device circuitry 100A may receive a data input signal Din when a clock signal clk is low and provide a data output signal Qout when the clock signal clk is rising. The clock signal clk may include a single-phase clocked signal. The multiple stages 102, 104, 104A, 106, 108 may be arranged and coupled together so as to receive the data input signal Din and provide the data output signal Qout. The circuitry 100A may include a transistor M1 that is coupled between a first voltage supply Vdd and node X1, and the transistor M1 is activated and deactivated based on the clock signal clk. The transistor M1 is coupled to the first stage 102 and the third stage 106 via node X1.

In some implementations, the circuitry 100A may be embodied with flip-flops structures having a scan (test) feature, wherein the flip-flop structures may have set/reset features embedded, e.g., in the second stage 104 and the fourth stage 108. As such, in some instances, the second stage 104 may receive set/reset signals, and the fourth stage 108 may receive set signals. Further, signals may pass between stages 102, 104, 104A, 106, 108, which is described in greater detail herein in reference to FIGS. 2-4.

In various implementations, the sequential logic device circuitry 100A may be embodied as a scan cell having one or more D-flip-flops (DFFs), which refer to positive edge (posedge) triggered storage devices. As shown in FIG. 1A, the first stage 102 of the circuitry 100A may receive a scan input/test (SI) signal and a scan enable/test (SE) signal, and the first stage 102 may include one or more multiplexer (MUX) structures that use the SI signal and the SE signal to provide the output signal (Q). In reference to scan (test) features, when the scan enable (SE) signal is on, the circuitry 100A may be under test and may receive input from the scan input signal (SE). In reference to set features, when the set feature is active, the output signal (Q) will be high, regardless of the data input (Din). In reference to the reset features, when the reset feature is active, the output signal (Q) will be low, regardless of the data input (Din). Internally, some DFFs may be provided with a ph2 D-latch (e.g., latch is open, when the clock is low) and a ph1 D-latch (e.g., latch is open, when the clock is high). Further, the output signal (Q) of the DFF may serve as a scan output (SO) signal that may be based on the scan input (SI) signal and the scan enable (SE) signal. As such, the sequential logic device circuitry 100A may be configured as a master-slave type MUX-DFF type scan cell having one or more multiplexers (MUXs), ph2 D-latches, and ph1 D-latches.

Figure 1B:
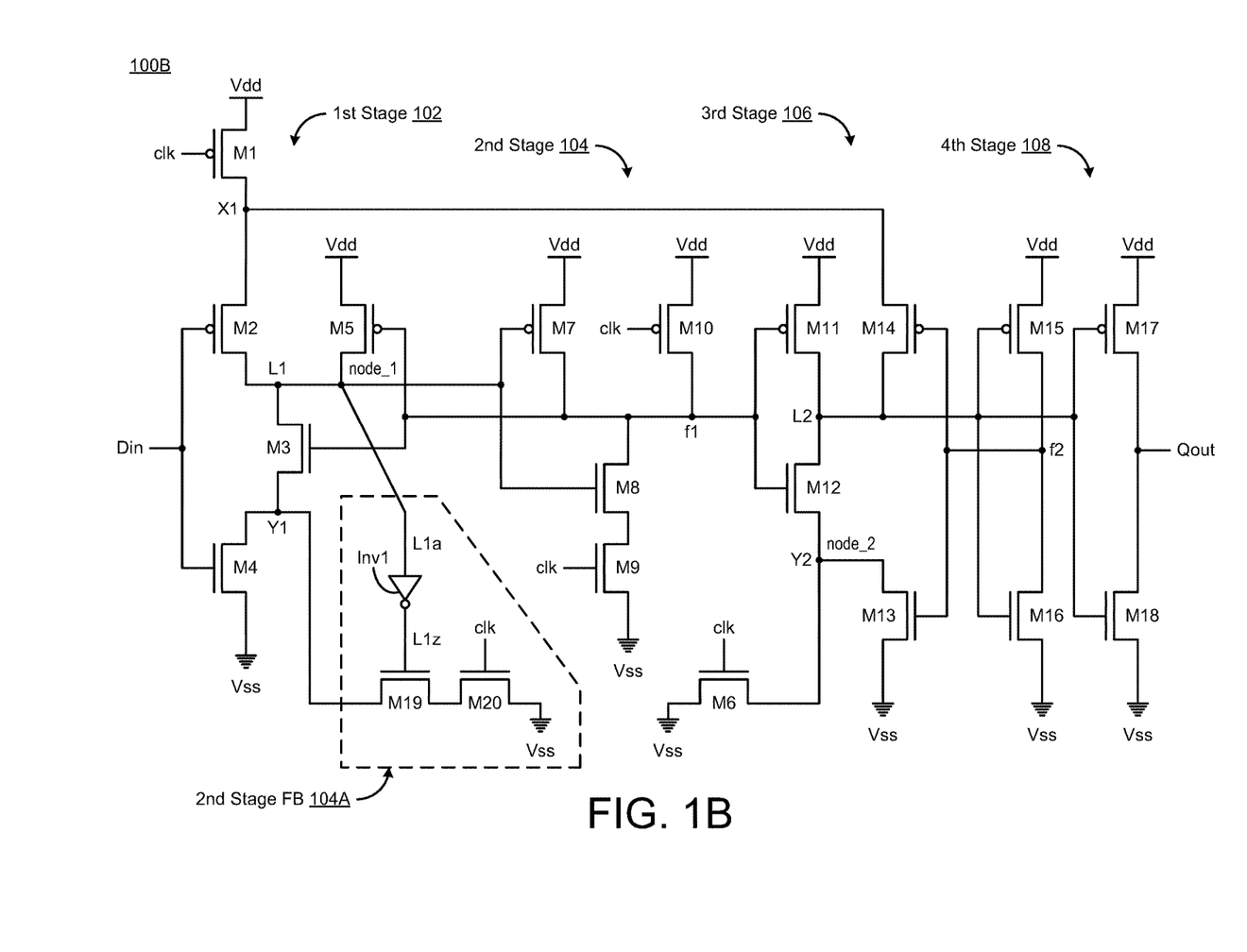

FIG. 1B illustrates a schematic diagram of sequential logic device circuitry 100B that utilizes single-phase clock operation in accordance with implementations described herein.

As shown, the sequential logic device circuitry 100B may include multiple transistors that may be implemented as an integrated circuit (IC) in various types of memory applications, such as, e.g., any type of memory, including any type of volatile and non-volatile memory. In some cases, the sequential logic device circuitry 100B may be implemented as an IC with single or dual rail memory architecture. In other cases, the sequential logic device circuitry 100B may be integrated with various types of computing circuitry and/or various related components on a single chip. Further, the sequential logic device circuitry 100B may be implemented in an embedded system for various electronic and mobile applications, including Internet of Things (IoT) applications.

As shown in FIG. 1B, the sequential logic device circuitry 100B may be embodied as a D-flip flop (DFF) that receives a data input signal Din when a clock signal clk is low and provides a data output signal Qout when the clock signal clk is rising. The clock signal clk may include a single-phase clocked signal. The sequential logic device circuitry 100B may include multiple stages 102, 104, 104A, 106, 108 that are arranged and coupled together so as to receive the data input signal Din and provide the data output signal Qout. Further, as shown, the sequential logic device circuitry 100B may be coupled between a first voltage supply Vdd and a second voltage supply Vss, wherein the first voltage supply Vdd may be greater than ground Gnd, and the second voltage supply Vss may be equal to ground Gnd.

In some implementations, the sequential logic device circuitry 100B may include multiple stages, such as, e.g., a first stage 102, a second stage 104, a third stage 106, and a fourth stage 108. Further, the second stage 104 may include a feedback stage 104A.

The sequential logic device circuitry 100B may include the first stage 102 having a first plurality of transistors M1, M2, M3, M4, M5 that are arranged to receive the data input signal Din and the clock signal clk and provide a first signal L1 (or net signal) and a second signal Y1 based on the data input signal Din and the clock signal clk.

The first plurality of transistors M1, M2, M3, M4, M5 of the first stage 102 may include P-type and N-type metal-semiconductor-oxide (PMOS, NMOS) transistors, such as, e.g., PMOS transistors M1, M2, M5 and NMOS transistors M3, M4.

The transistor M1 is coupled between the first voltage supply Vdd and node X1, and the transistor M1 is activated and deactivated based on the clock signal clk. The transistor M2 is coupled between the transistor M1 at node X1 and the transistor M3 at node L1, and the transistor M2 is activated and deactivated based on the data input signal Din. The transistor M3 is coupled between the transistor M2 at node L1 and the transistor M4 at node Y1, and the transistor M3 is activated and deactivated based on an intermediate signal at node f1. The transistor M4 is coupled between the transistor M3 at node Y1 and the second voltage supply Vss (or ground Gnd), and the transistor M4 is activated and deactivated based on the data input signal Din. The transistor M5 is coupled between the first voltage supply Vdd and the transistor M3 at node L1, and the transistor M5 is activated and deactivated based on the intermediate signal at node f1.

The sequential logic device circuitry 100B may include the second stage 104 having the feedback stage 104A, wherein the second stage 104 includes a second plurality of transistors M6, M7, M8, M9, M10 along with M19, M20 and inverter Inv1 that are arranged to receive the first signal L1 from the first stage 102. The inverter Inv1 includes two (2) transistors (e.g., two (2) complementary transistors) that are arranged to invert the first signal L1 and provide the inverted first signal L1z. As shown, the feedback stage 104A receives the first signal L1 from the first stage 102 and provide an inverted first signal L1z (or inverted net signal) to a gate of a first pass transistor M19. As shown, the first pass transistor M19 allows the second signal Y1 to pass from the first stage 102 to a second pass transistor M20 based on the inverted first signal L1z, and the second pass transistor M20 allows the second signal Y1 to pass from the first pass transistor M19 to ground Gnd or Vss based on the clock signal clk.

The second plurality of transistors M6, M7, M8, M9, M10, M19, M20 along with Inv1 of the second stage 104 and the feedback stage 104A may include PMOS, NMOS transistors, such as, e.g., PMOS transistors M7, M10 and NMOS transistors M6, M8, M9, M19, M20. Further, the inverter Inv1 of the feedback stage 104A may include one (1) PMOS transistor and one (1) NMOS transistor.

The transistor M6 is coupled between the transistor M12 at node Y2 and the second voltage supply Vss (or ground Gnd), and the transistor M6 is activated and deactivated based on the clock signal clk. The transistor M7 is coupled between the first voltage supply Vdd and the transistor M8 at node f1, and the transistor M7 is activated and deactivated based on the first signal L1. The transistor M8 is coupled between the transistor M7 at node f1 and the transistor M9, and the transistor M8 is activated and deactivated based on the first signal L1. The transistor M9 is coupled between the transistor M8 and the second voltage supply Vss (or ground Gnd), and the transistor M9 is activated and deactivated based on the clock signal clk. The transistor M10 is coupled between the first voltage supply Vdd and the transistor M8 at node f1, and the transistor M10 is activated and deactivated based on the clock signal clk.

Further, the inverter Inv1 is coupled between the transistor M5 at node L1 and the transistor M19. The transistor M19 is coupled between the transistors M3, M4 at node Y1 and the transistor M20, and the transistor M19 is activated and deactivated based on the inverted signal L1z. The transistor M20 is coupled between the transistor M19 and the second voltage supply Vss (or ground Gnd), and the transistor M20 is activated and deactivated based on the clock signal clk.

In some implementations, the second stage 104 is coupled to the first stage 102, wherein the first stage 102 may be referred to as an input stage that receives the data input signal Din when the clock signal clk is low, and the second stage 104 may be referred to as a first intermediate stage having the feedback stage 104A. Further, as shown, the feedback stage 104A is coupled to the first stage 104.

The sequential logic device circuitry 100B may include the third stage 106 having a third plurality of transistors M11, M12, M13, M14. The third stage 106 is coupled to the second stage 104, and the third stage 106 may be referred to as a second intermediate stage. Further, as shown in FIG. 1B, the third plurality of transistors M11, M12, M13, M14 of the third stage 106 may include PMOS, NMOS transistors, such as, e.g., PMOS transistors M11, M14 and NMOS transistors M12, M13.

The transistor M11 is coupled between the first voltage supply Vdd and the transistor M12 at node L2, and the transistor M11 is activated and deactivated based on the intermediate voltage at node f1. The transistor M12 is coupled between the transistor M11 at node L2 and the transistors M6, M13 at node Y2, and the transistor M12 is activated and deactivated based on the intermediate voltage at node f1. The transistor M13 is coupled between the transistors M6, M12 at node Y2 and the second voltage supply Vss (or ground Gnd), and the transistor M13 is activated and deactivated based on an intermediate voltage at node f2. Further, the transistor M14 is coupled between the transistor M1 at node X1 and the transistor M12 at node L2, and the transistor M14 is activated and deactivated based on the intermediate voltage at node f2.

The sequential logic device circuitry 100B may include the fourth stage 108 having a fourth plurality of transistors M15, M16, M17, M18. The fourth stage 108 is coupled to the third stage 106, and the fourth stage 108 may be referred to as an output stage that provides the data output signal Qout when the clock signal clk is rising. Further, as shown in FIG. 1B, the fourth plurality of transistors M15, M16, M17, M18 of the fourth stage 108 may include PMOS, NMOS transistors, such as, e.g., PMOS transistors M15, M17 and NMOS transistors M16, M18.

The transistor M15 is coupled between the first voltage supply Vdd and the transistor M16 at node f2, and the transistor M15 is activated and deactivated based on an intermediate voltage at node L2. The transistor M16 is coupled between the transistor M15 at node f2, and the transistor M16 is activated and deactivated based on the intermediate voltage at node L2. The transistor M17 is coupled between the first voltage supply Vdd and the transistor M18 at the output node Qout, and the transistor M17 is activated and deactivated based on an intermediate voltage at node L2. The transistor M18 is coupled between the transistor M17 at the output node Qout, and the transistor M18 is activated and deactivated based on the intermediate voltage at node L2.

In some implementations, the sequential logic device circuitry 100B may be embodied as a D-Flip-flop (DFF) having 22 transistors, including transistors M1-M20 plus the two (2) transistors of the inverter Inv1. The sequential logic device circuitry 100B may be embodied as a scan cell having one or more D-flip-flops (DFFs). The DFF is a positive edge (posedge) triggered storage device. Internally, some DFFs may be provided with a ph2 D-latch (e.g., latch is open, when the clock is low) and a ph1 D-latch (e.g., latch is open, when the clock is high). The output Q of the DFF may serve as a scan output (SO) signal. The sequential logic device circuitry 100B may be configured as a master-slave type MUX-DFF type scan cell having one or more multiplexers (MUXs), ph2 D-latches, and ph1 D-latches.

Figure 2:
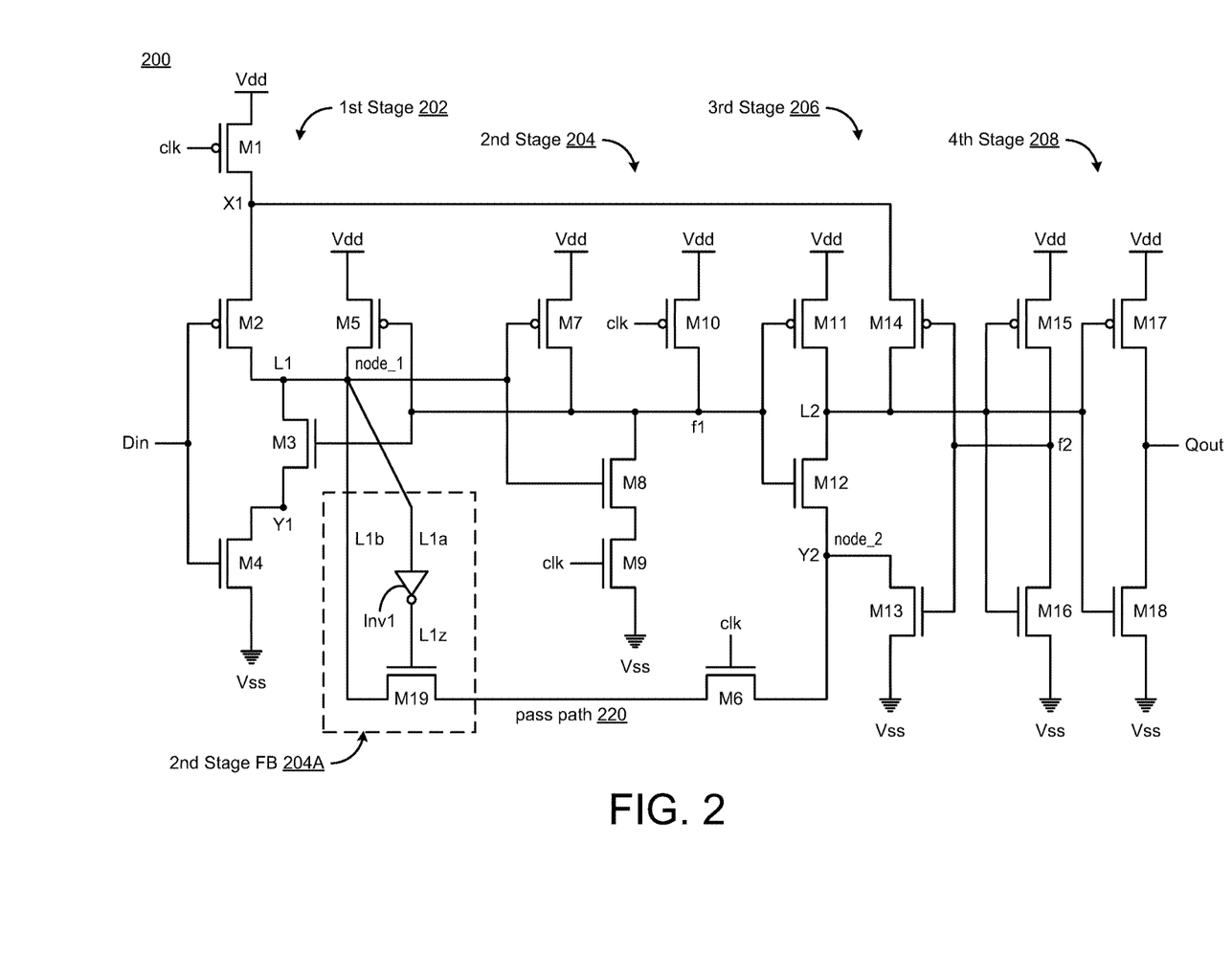

FIG. 2 illustrates a schematic diagram of sequential logic device circuitry 200 that utilizes single-phase clock operation in accordance with implementations described herein. The sequential logic device circuitry 200 of FIG. 2 is similar to the sequential logic device circuitry 100B of FIG. 1B, wherein similar components have similar functionality and scope. However, as described herein below, some particular arrangements of the components in the sequential logic device circuitry 200 of FIG. 2 are different than the arrangements of components in the sequential logic device circuitry 100B of FIG. 1B.

For instance, as shown in FIG. 2, the sequential logic device circuitry 200 may be embodied as a D-flip flop (DFF) that receives a data input signal Din when a clock signal clk is low and provides a data output signal Qout when the clock signal clk is rising. The clock signal clk may include a single-phase clocked signal. The sequential logic device circuitry 200 may include multiple stages 202, 204, 204A, 206, 208 that are arranged and coupled together so as to receive the data input signal Din and provide the data output signal Qout. Further, as shown, the sequential logic device circuitry 200 may be coupled between the first voltage supply Vdd and the second voltage supply Vss, wherein the first voltage supply Vdd may be greater than ground Gnd, and the second voltage supply Vss may be equal to ground Gnd.

In some implementations, the sequential logic device circuitry 200 may include multiple stages, such as, e.g., a first stage 202, a second stage 204, a third stage 206, and a fourth stage 208. Further, the second stage 204 may include a feedback stage 204A.

As shown in FIG. 2, the multiple stages 202, 204, 206, 208 may be arranged and coupled together in a similar manner as the multiple stages 102, 104, 106, 108 of the sequential logic device circuitry 100B of FIG. 1B with the exception of the arrangement of the feedback stage 204A of the sequential logic device circuitry 200 of FIG. 2 is different than the arrangement of the feedback stage 104A of the sequential logic device circuitry 100B of FIG. 1B.

For instance, as shown in FIG. 2, the sequential logic device circuitry 200 includes the first stage 202 having the first plurality of transistors M1, M2, M3, M4, M5 that are arranged to receive the data input signal Din and the clock signal clk and provide the net signal L1 (or first signal) based on the data input signal Din and the clock signal clk.

The sequential logic device circuitry 200 may include the second stage 204 having the feedback stage 204A, wherein the second stage 204 includes the second plurality of transistors M6, M7, M8, M9, M10 along with M19 (without M20) and inverter Inv1 that are arranged to receive the first signal L1 from the first stage 202. The inverter Inv1 includes two (2) transistors (e.g., two (2) complementary transistors) that are arranged to invert the first signal L1 and provide the inverted first signal L1z. As shown, the feedback stage 204A receives the net signal L1 from the first stage 202 via a first node (L1: node_1) and provides the inverted net signal L1z to a gate of the first pass transistor M19 via a first path L1a. The first pass transistor M19 allows the net signal L1 to pass from the first stage 202 via the first node (L1: node_1) and via a second path L1b to the transistor M6 (as a second pass transistor) based on the inverted net signal L1z. The transistor M6 (as a second pass transistor) allows the net signal L1 to pass from the first pass transistor M19 to a second node (Y2: node_2) of a third stage 206 based on the clock signal clk.

As shown in FIG. 2, the first stage 202 may be referred to as an input stage that receives the data input signal Din when the clock signal clk is low, and the second stage 204 may be referred to as a first intermediate stage. The third stage 206 is coupled to the second stage 204 and the feedback stage 204A, and the third stage 206 may be referred to as a second intermediate stage. Further, the fourth stage 208 is coupled to the third stage 206, and the fourth stage 208 may be referred to as an output stage that provides the data output signal Qout when the clock signal clk is rising.

In some implementations, the sequential logic device circuitry 200 may be embodied as a D-Flip-flop (DFF) having 21 transistors, including transistors M1-M19 plus the two (2) transistors of the inverter Inv1. The sequential logic device circuitry 200 may be embodied as a scan cell having one or more D-flip-flops (DFFs). The DFF is a positive edge (posedge) triggered storage device. Internally, some DFFs may be provided with a ph2 D-latch (e.g., latch is open, when the clock is low) and a ph1 D-latch (e.g., latch is open, when the clock is high). The output Q of the DFF may serve as a scan output (SO) signal. The sequential logic device circuitry 200 may be configured as a master-slave type MUX-DFF type scan cell having one or more multiplexers (MUXs), ph2 D-latches, and ph1 D-latches.

Figure 3:
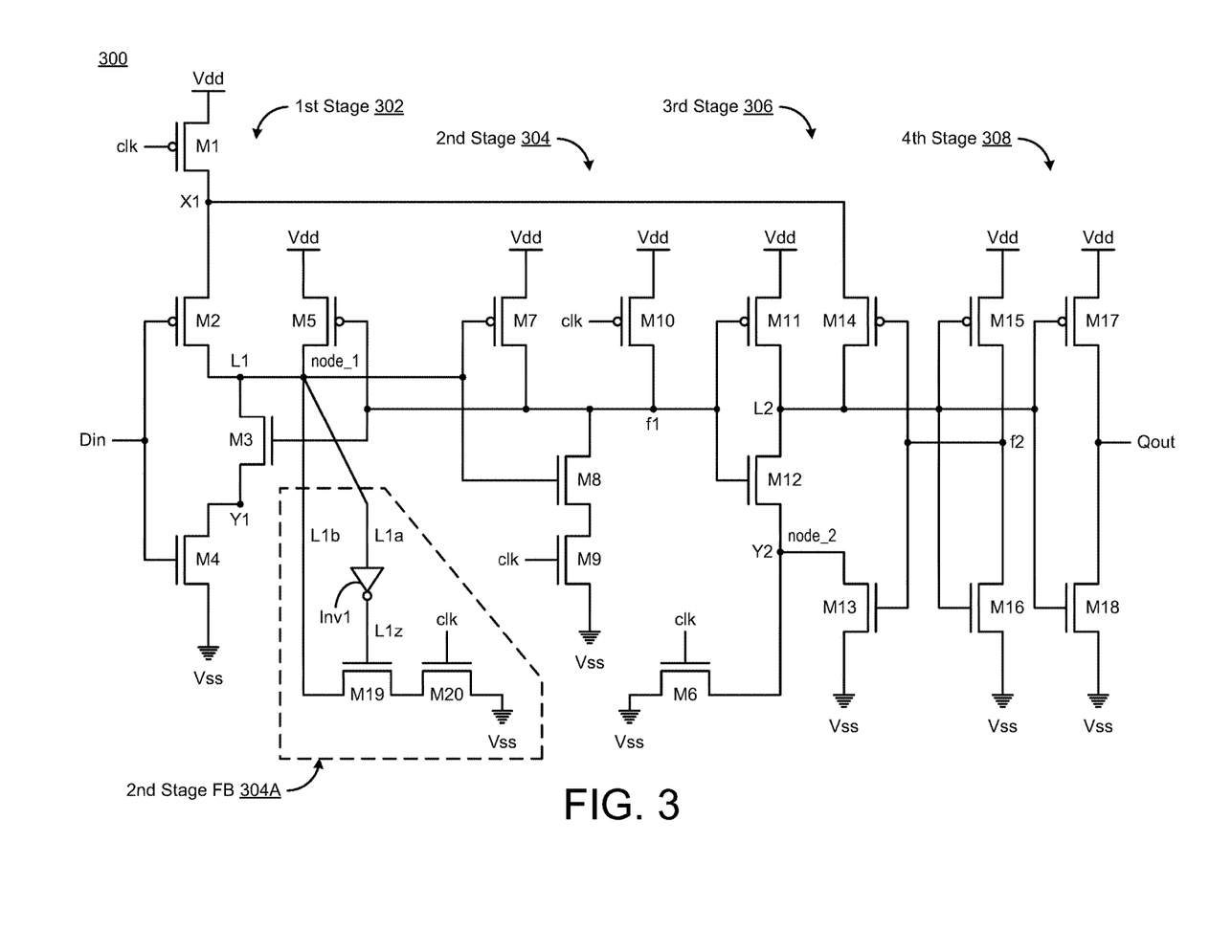

FIG. 3 illustrates a schematic diagram of sequential logic device circuitry 300 that utilizes single-phase clock operation in accordance with implementations described herein. The sequential logic device circuitry 300 of FIG. 3 is similar to the sequential logic device circuitry 100B of FIG. 1B, wherein similar components have similar functionality and scope. However, as described herein below, some particular arrangements of the components in the sequential logic device circuitry 300 of FIG. 3 are different than the arrangements of components in the sequential logic device circuitry 100B of FIG. 1B.

For instance, as shown in FIG. 3, the sequential logic device circuitry 300 may be embodied as a D-flip flop (DFF) that receives a data input signal Din when a clock signal clk is low and provides a data output signal Qout when the clock signal clk is rising. The clock signal clk may include a single-phase clocked signal. The sequential logic device circuitry 300 may include multiple stages 302, 304, 304A, 306, 308 that are arranged and coupled together so as to receive the data input signal Din and provide the data output signal Qout. Further, as shown, the sequential logic device circuitry 300 may be coupled between the first voltage supply Vdd and the second voltage supply Vss, wherein the first voltage supply Vdd may be greater than ground Gnd, and the second voltage supply Vss may be equal to ground Gnd.

In some implementations, the sequential logic device circuitry 300 may include multiple stages, such as, e.g., a first stage 302, a second stage 304, a third stage 306, and a fourth stage 308. Further, the second stage 304 may include a feedback stage 304A.

As shown in FIG. 3, the multiple stages 302, 304, 306, 308 may be arranged and coupled together in a similar manner as the multiple stages 102, 104, 106, 108 of the sequential logic device circuitry 100B of FIG. 1B with the exception of the arrangement of the feedback stage 304A of the sequential logic device circuitry 300 of FIG. 3 is different than the arrangement of the feedback stage 104A of the sequential logic device circuitry 100B of FIG. 1B.

For instance, as shown in FIG. 3, the sequential logic device circuitry 300 includes the first stage 302 having the first plurality of transistors M1, M2, M3, M4, M5 that are arranged to receive the data input signal Din and the clock signal clk and provide the net signal L1 (or first signal) based on the data input signal Din and the clock signal clk.

The sequential logic device circuitry 300 may include the second stage 304 having the feedback stage 304A, wherein the second stage 304 includes the second plurality of transistors M6, M7, M8, M9, M10 along with M19, M20 and inverter Inv1 that are arranged to receive the first signal L1 from the first stage 202. The inverter Inv1 includes two (2) transistors (e.g., two (2) complementary transistors) that are arranged to invert the first signal L1 and provide the inverted first signal L1z. As shown, the feedback stage 304A receives the net signal L1 from the first stage 302 via the first node (or net node: L1: node_1) and provides the inverted net signal L1z to the gate of the first pass transistor M19 via the first path L1a. The first pass transistor M19 allows the net signal L1 to pass from the first stage 302 via the first node (or net node: L1: node_1) and via the second path L1b to the second pass transistor M20 based on the inverted net signal L1z. The second pass transistor M20 allows the net signal L1 to pass from the first pass transistor M19 to ground Gnd (or Vss) based on the clock signal clk.

As shown in FIG. 3, the first stage 302 may be referred to as an input stage that receives the data input signal Din when the clock signal clk is low, and the second stage 304 may be referred to as a first intermediate stage. The third stage 306 is coupled to the second stage 304 and the feedback stage 304A, and the third stage 306 may be referred to as a second intermediate stage. Further, the fourth stage 308 is coupled to the third stage 306, and the fourth stage 308 may be referred to as an output stage that provides the data output signal Qout when the clock signal clk is rising.

In some implementations, the sequential logic device circuitry 300 may be embodied as a D-Flip-flop (DFF) having 22 transistors, including transistors M1-M20 plus the two (2) transistors of the inverter Inv1. The sequential logic device circuitry 300 may be embodied as a scan cell having one or more D-flip-flops (DFFs). The DFF is a positive edge (posedge) triggered storage device. Internally, some DFFs may be provided with a ph2 D-latch (e.g., latch is open, when the clock is low) and a ph1 D-latch (e.g., latch is open, when the clock is high). The output Q of the DFF may serve as a scan output (SO) signal. The sequential logic device circuitry 300 may be configured as a master-slave type MUX-DFF type scan cell having one or more multiplexers (MUXs), ph2 D-latches, and ph1 D-latches.

Figure 4:
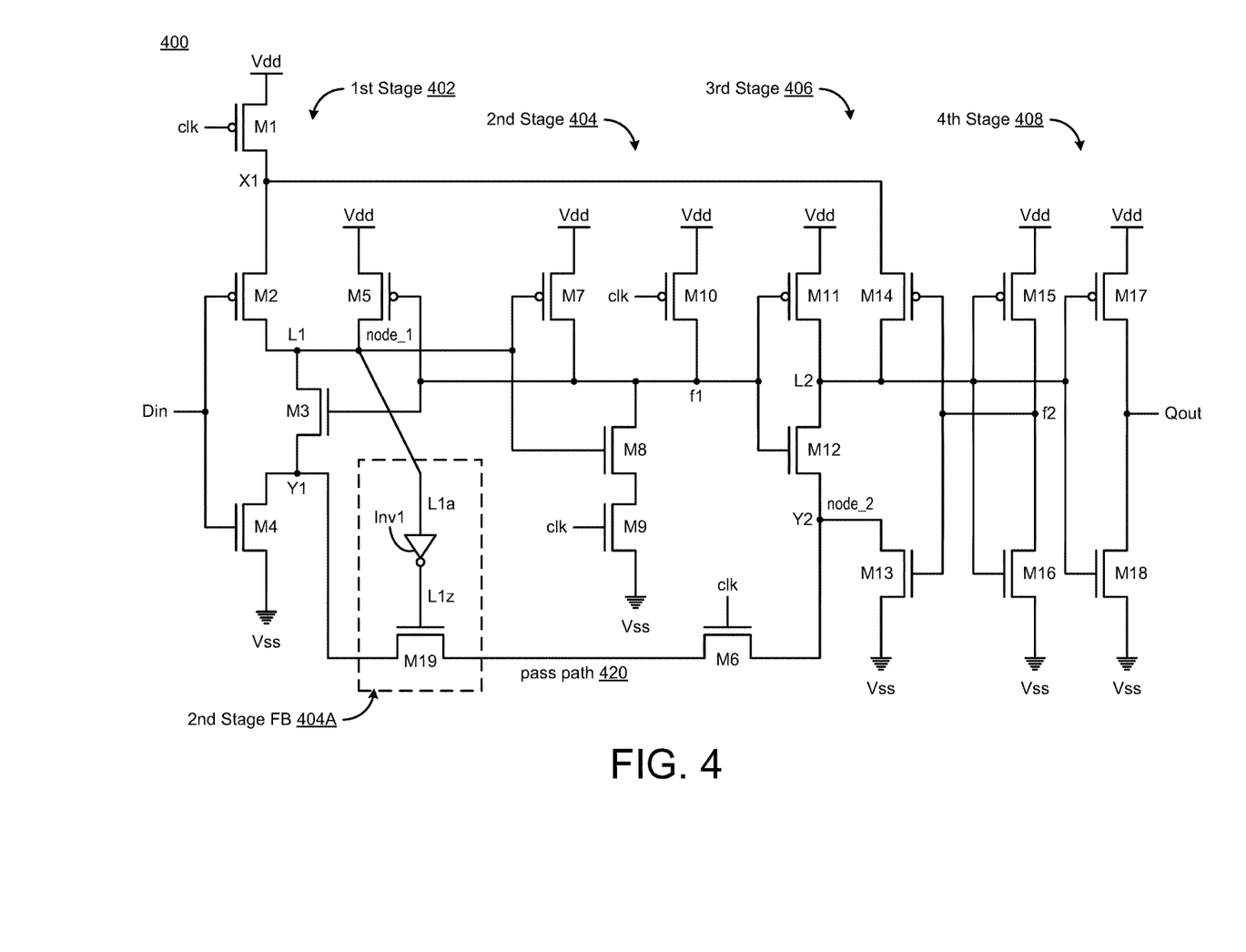

FIG. 4 illustrates a schematic diagram of sequential logic device circuitry 400 that utilizes single-phase clock operation in accordance with implementations described herein. The sequential logic device circuitry 400 of FIG. 4 is similar to the sequential logic device circuitry 100B of FIG. 1B, wherein similar components have similar functionality and scope. However, as described herein below, some particular arrangements of the components in the sequential logic device circuitry 400 of FIG. 4 are different than the arrangements of components in the sequential logic device circuitry 100B of FIG. 1B.

For instance, as shown in FIG. 4, the sequential logic device circuitry 300 may be embodied as a D-flip flop (DFF) that receives a data input signal Din when a clock signal clk is rising and provides a data output signal Qout when the clock signal clk is falling. The clock signal clk may include a single-phase clocked signal. The sequential logic device circuitry 400 may include multiple stages 402, 404, 404A, 406, 408 that are arranged and coupled together so as to receive the data input signal Din and provide the data output signal Qout. Further, as shown, the sequential logic device circuitry 400 may be coupled between the first voltage supply Vdd and the second voltage supply Vss, wherein the first voltage supply Vdd may be greater than ground Gnd, and the second voltage supply Vss may be equal to ground Gnd.

In some implementations, the sequential logic device circuitry 400 may include multiple stages, such as, e.g., a first stage 402, a second stage 404, a third stage 406, and a fourth stage 408. Further, the second stage 404 may include a feedback stage 404A.

As shown in FIG. 4, the multiple stages 402, 404, 406, 408 may be arranged and coupled together in a similar manner as the multiple stages 102, 104, 106, 108 of the sequential logic device circuitry 100B of FIG. 1B with the exception of the arrangement of the feedback stage 404A of the sequential logic device circuitry 400 of FIG. 4 is different than the arrangement of the feedback stage 104A of the sequential logic device circuitry 100B of FIG. 1B.

For instance, as shown in FIG. 4, the sequential logic device circuitry 400 includes the first stage 402 having the first plurality of transistors M1, M2, M3, M4, M5 that are arranged to receive the data input signal Din and the clock signal clk and provide the first signal L1 (or net signal) and the second signal Y1 based on the data input signal Din and the clock signal clk. The transistor M3 is coupled between the nodes L1 and Y1.

The sequential logic device circuitry 400 may include the second stage 404 having the feedback stage 404A, wherein the second stage 404 includes the second plurality of transistors M6, M7, M8, M9, M10 along with M19 (without M20) and inverter Inv1 that are arranged to receive the first signal L1 from the first stage 402. The inverter Inv1 includes two (2) transistors (e.g., two (2) complementary transistors) that are arranged to invert the first signal L1 and provide the inverted first signal L1z. As shown, the feedback stage 404A receives the first signal L1 from the first stage 402 via the first node (L1: node_1) and provides the inverted net signal L1z to a gate of the first pass transistor M19 via the first path L1a. The first pass transistor M19 allows the second signal Y1 to pass from the first stage 402 to the transistor M6 (as a second pass transistor) based on the inverted first signal L1z. The transistor M6 (as a second pass transistor) allows the second signal Y1 to pass from the first pass transistor M19 to the third stage 406 at the second node (Y2: node_2) based on the clock signal clk.

As shown in FIG. 4, the first stage 402 may be referred to as an input stage that receives the data input signal Din when the clock signal clk is low, and the second stage 404 may be referred to as a first intermediate stage. The third stage 406 is coupled to the second stage 404 and the feedback stage 404A, and the third stage 406 may be referred to as a second intermediate stage. Further, the fourth stage 408 is coupled to the third stage 406, and the fourth stage 408 may be referred to as an output stage that provides the data output signal Qout when the clock signal clk is rising.

In some implementations, the sequential logic device circuitry 400 may be embodied as a D-Flip-flop (DFF) having 21 transistors, including transistors M1-M19 plus the two (2) transistors of the inverter Inv1. The sequential logic device circuitry 400 may be embodied as a scan cell having one or more D-flip-flops (DFFs). The DFF is a positive edge (posedge) triggered storage device. Internally, some DFFs may be provided with a ph2 D-latch (e.g., latch is open, when the clock is low) and a ph1 D-latch (e.g., latch is open, when the clock is high). The output Q of the DFF may serve as a scan output (SO) signal. The sequential logic device circuitry 400 may be configured as a master-slave type MUX-DFF type scan cell having one or more multiplexers (MUXs), ph2 D-latches, and ph1 D-latches.

Various implementations described herein illustrate the concept of breaking a pass transistor path 220, 420 between transistors M19 and M6 of FIGS. 2 and 4 into transistors M19/M20 and M6 of FIGS. 1B and 3. For instance, the concept of breaking the pass transistor path 420 forms the ideas for the embodiments of FIG. 4 into FIG. 1B. As shown, it is possible to break the pass path 420 in FIG. 4 to implement transistors M19/M20 and assist with fixing issues with hold time. When breaking the pass path 220, 420, the nets Y1 and Y2 may both keep a copy of the M19 and M6 series device path and have M6 connect to ground VSS on both branches. Without incorporating clock merging, this implementation may increase transistor count and may increase clock load.

Various implementations described herein also illustrate the concept of merging clocks as shown, e.g., in FIGS. 1B and 3. For instance, the concept of merging clocks may derive the embodiment of FIG. 1B, e.g., by merging M20 and M6 into M6 in the embodiment of FIG. 4. This merging connects the first stage 102 and the third stage 106. This may also be observed in FIG. 3 to FIG. 2 as well. This embodiment may decrease load on the clock signal clk and may decrease transistor count. Also, this concept may be applied to different transistors connected to the clock signal clk, as long as the functionality of the circuit remains the same. The merging of transistors with clock signals may be performed on M20 and M9 in FIG. 1B by joining the net between M8 and M9 and the net between M19 and M20 for the source and to keep the drain at VSS.

Multibit flops are widely used in some of today's products. Multibit flops may offer the ability to reduce area at block level by sharing common logic/transistors across single-bit flops. For instance, transistors M1, M20, M9 and M6 as illustrated in FIG. 1B may be shared across multiple-bit flops (e.g., 2 or more) for both area and power savings. As such, in some scenarios, the various implementations described herein provide for the merging and hence the reduced number of clock connected transistors.

Described herein are various implementations of an integrated circuit. The integrated circuit may include a sequential logic device that receives a data input signal when a clock signal is low and provides a data output signal when the clock signal is rising. The sequential logic device may include a first stage having a first plurality of transistors that are arranged to receive the data input signal and the clock signal and provide a first signal and a second signal based on the data input signal and the clock signal. The sequential logic device may include a second stage having a second plurality of transistors that are arranged to receive the first signal from the first stage and provide an inverted first signal to a gate of a first pass transistor. The first pass transistor may allow the second signal to pass from the first stage to a second pass transistor based on the inverted first signal, and the second pass transistor may allow the second signal to pass from the first pass transistor to ground based on the clock signal.

Described herein are various implementations of an integrated circuit. The integrated circuit may include a sequential logic device that receives a data input signal when a clock signal is low and provides a data output signal when the clock signal is rising. The sequential logic device may include a first stage having a first plurality of transistors that are arranged to receive the data input signal and the clock signal and provide a net signal based on the data input signal and the clock signal. The sequential logic device may include a second stage having a second plurality of transistors that are arranged to receive the net signal from the first stage via a first node and provide an inverted net signal to a gate of a first pass transistor via a first path. The first pass transistor may allow the net signal to pass from the first stage via the first node and via a second path to a second pass transistor based on the inverted net signal. The second pass transistor may allow the net signal to pass from the first pass transistor to a second node of a third stage based on the clock signal.

Described herein are various implementations of an integrated circuit. The integrated circuit may include a sequential logic device that receives a data input signal when a clock signal is low and provides a data output signal when the clock signal is rising. The sequential logic device may include a first stage having a first plurality of transistors that are arranged to receive the data input signal and the clock signal and provide a net signal based on the data input signal and the clock signal. The sequential logic device may include a second stage having a second plurality of transistors that are arranged to receive the net signal from the first stage via a net node and provide an inverted net signal to a gate of a first pass transistor via the first path. The first pass transistor may allow the net signal to pass from the first stage via the net node and via a second path to a second pass transistor based on the inverted net signal. The second pass transistor may allow the net signal to pass from the first pass transistor to ground based on the clock signal.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    a sequential logic device that receives a data input signal when a clock signal is low and provides a data output signal when the clock signal is rising,
    wherein the sequential logic device comprises a first stage having a first plurality of transistors that are arranged to receive the data input signal and the clock signal and provide a first signal and a second signal based on the data input signal and the clock signal; and
    wherein the sequential logic device comprises a second stage having a second plurality of transistors that are arranged to receive the first signal from the first stage and provide an inverted first signal to a gate of a first pass transistor, wherein the first pass transistor allows the second signal to pass from the first stage to a second pass transistor based on the inverted first signal, and wherein the second pass transistor allows the second signal to pass from the first pass transistor to ground based on the clock signal.

2. The integrated circuit of claim 1, wherein the sequential logic device is coupled between a first voltage supply (Vdd) and a second voltage supply (Vss), and wherein the first voltage supply (Vdd) is greater than ground (Gnd), and wherein the second voltage supply (Vss) is equal to ground (Gnd).

3. The integrated circuit of claim 1, wherein the sequential logic device comprises a D-Flip-flop having 22 transistors.

4. The integrated circuit of claim 1, wherein the clock signal comprises a single-phase clocked signal.

5. The integrated circuit of claim 1, wherein the second stage is coupled to the first stage, and wherein the first stage comprises an input stage that receives the data input signal when the clock signal is low, and wherein the second stage comprises a first intermediate stage.

6. The integrated circuit of claim 5, wherein the sequential logic device comprises a third stage that is coupled to the second stage, and wherein the third stage comprises a second intermediate stage.

7. The integrated circuit of claim 6, wherein the sequential logic device comprises a fourth stage that is coupled to the third stage, and wherein the fourth stage comprises an output stage that provides the data output signal when the clock signal is rising.

* * * * *